United States Patent [19]

Bowlds et al.

[11] Patent Number: 4,617,531
[45] Date of Patent: Oct. 14, 1986

[54] DIRECTLY MODULATED MICROWAVE OSCILLATOR HAVING ADJUSTABLE LOAD COUPLING

[75] Inventors: Daniel P. Bowlds, Hawesville; Edward B. Foster, Owensboro, both of Ky.

[73] Assignee: General Electric Company, Syracuse, N.Y.

[21] Appl. No.: 775,926

[22] Filed: Sep. 13, 1985

[51] Int. Cl.$^4$ .................................... H03B 5/08
[52] U.S. Cl. ............................ 331/96; 331/107 R
[58] Field of Search ........... 331/96, 107 R, 107 DP, 331/107 G, 117 D, 177 V; 333/250

[56] References Cited

U.S. PATENT DOCUMENTS

| | | | |
|---|---|---|---|
| 3,982,211 | 9/1976 | Endersz | 331/96 X |
| 4,305,049 | 12/1981 | Bastida | 331/107 G X |
| 4,371,849 | 2/1983 | Longley | 331/107 G X |

Primary Examiner—Eugene R. LaRoche
Assistant Examiner—D. C. Mis
Attorney, Agent, or Firm—Richard V. Lang; Carl W. Baker

[57] ABSTRACT

A directly modulated microwave source for use in communications equipment is disclosed. The arrangement, fabricated in an open ended waveguide comprises an oscillator section operating in the $TE_{101}$ mode and an impedance matching section providing adjustable coupling to a load. A suitable active element is a Gunn diode, post mounted in proximity to the closed end of the waveguide for H field coupling. Modulation in frequency or phase is achieved by a varactor diode, also post mounted, positioned approximately $\frac{2}{3}$ of the length of the waveguide from the closed end. A vertically adjusted post for the load coupling adjustment, is placed adjacent the varactor post, but nearer the opening. The two adjacent posts define the boundary between sections and provide H field coupling to the varactor diode. Temperature stabilization means and frequency tuning means are located respectively on the upper and lower surfaces of the waveguide at anti-nodal portions of the oscillator section.

5 Claims, 4 Drawing Figures

DIRECTLY MODULATED MICROWAVE OSCILLATOR HAVING ADJUSTABLE LOAD COUPLING

BACKGROUND OF THE INVENTION

1. Field of the Invention

The present invention relates to a directly modulated microwave source for use in communications equipment and more particularly to a microwave source combining an oscillator and an impedance matching section for adjustable coupling to a load.

2. Prior Art

Microwave sources of the type of interest herein find use in communications equipment, where they constitute the principal source of transmitted energy and are subject to direct modulation by an information signal for purposes of communicating information to a remote location. As the term microwave implies, the frequencies contemplated are of short wavelength, and are generally above 1 gigahertz. Actual communications band assignments are in the vicinity of 18 gHz and 22 gHz.

A known high frequency source has been fabricated using rectangular waveguide terminated at one end with a shorting end wall at the other end with an apertured end wall through which energy may be coupled to a load. The aperatured partition is typically at a fixed position in the waveguide and of fixed dimensions. Accordingly, when greater coupling is to be sought a simple means of adjustment is to increase the size of the aperture by boring it out. The method leads to only approximate matching, and is irreversable. In a conventional design a variable impedance transformer following the aperture may be required to insure adequate coupling when the load impedance has a different value from that of the oscillator or changes as the equipment is adjusted.

In practice, it is desirable that such resonators be directly modulatable as by a varactor diode, be sensitive to the modulating signal, be readily tuned to an exact operating frequency, have good frequency stability against temperature variation and yet be of a simple, low cost construction.

Because of the small size of the waveguide element, the four or five adjusting elements must be carefully positioned, to avoid unnecessary electrical interaction, and maximum mechanical convenience.

SUMMARY OF THE INVENTION

Accordingly, it is an object of the invention to provide a directly modulated microwave source having improved adjustable load coupling means.

It is another object of the invention to provide a directly modulated microwave source having improved adjustable load coupling means and improved sensitivity to modulation by a varactor diode.

It is an additional object of the invention to provide an improved directly modulated microwave source having improved load coupling means, improved modulation sensitivity, improved temperature stability, and economy of manufacture.

These and other objects of the invention are achieved in a novel microwave source comprising a rectangular waveguide, a negative resistance device, a varactor diode, and adjustable coupling post. The rectangular waveguide has a shorting wall at one end, and an opening at the other end. The waveguide is effectively divided into a resonator section having an electrical length of 180 degrees, and an adjustable load matching section having an electrical length variable through 90 degrees for adjustably coupling energy from the resonator via the opening to a waveguide load having a characteristic impedance differing from that of the waveguide.

The negative resistance device, typically a Gunn diode, and a coupling post are provided connected in series between the floor and ceiling of the resonator section, positioned near the shorted end to complete an H field coupling loop.

The varactor diode and a coupling post connected in series between the floor and ceiling of the waveguide, and a third post, are provided, the latter adjustably extending between the floor and ceiling of the waveguide for forming a low impedance between the ceiling and floor of said waveguide which defines the boundary between sections.

The series connected varactor diode and second post and the third post are spaced to provide an H field coupling loop near the outer boundary of the resonator section for achieving varactor tuning sensitivity.

The adjustment of the third post controls the electrical length of the impedance matching section and thereby provides the adjustable coupling.

In accordance with a further aspect of the invention, an adjustable temperature compensating member is provided, entering the waveguide (typically through the ceiling) oriented perpendicular to the floor and ceiling thereof and positioned approximately 90 electrical degrees from the shorting end wall, to provide a capacitance versus temperature characteristic of adjustable slope. In addition, a vernier tuning means comprising a dielectric rod is provided, entering the waveguide (typically through the floor) oriented perpendicular to the floor and ceiling thereof and positioned approximately 90 electrical degrees from the shorting end wall to adjust the operating frequency of the oscillator to a desired value.

BRIEF DESCRIPTION OF THE DRAWINGS

The inventive and distinctive features of the invention are set forth in the claims of the present invention. The invention itself, however, together with further objects and advantages thereof may best be understood by reference to the following description and accompanying drawings in which:

DESCRIPTION OF THE EMBODIMENT

Figure 1:
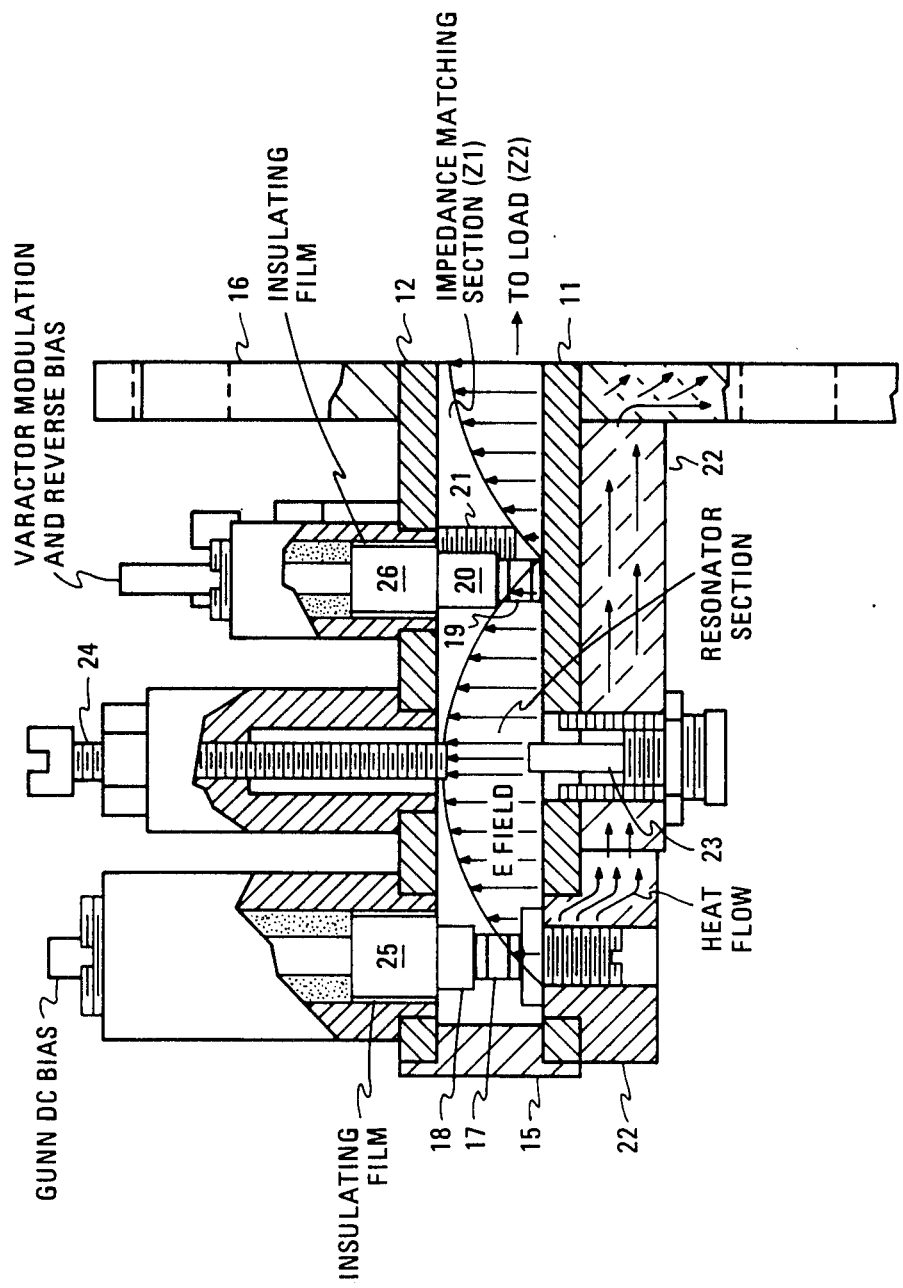
FIG. 1 is a side elevation view partly in cross-section of the microwave source containing a resonating section and an impedance matching section, formed within a waveguide including a representation of the E field distributions and the principal electrical adjusting elements associated with the source.
Figure 2A:
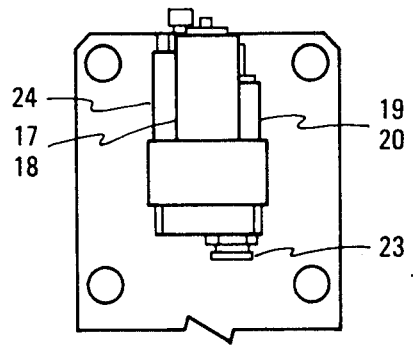
FIGS. 2A, 2B and 2C are respectively a rear view, a top view, and a front view of the microwave source, these views being designed to illustrate the positioning of the electrical adjusting elements associated with the cavity.
Figure 2B:
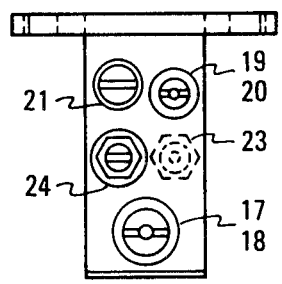
Figure 2C:
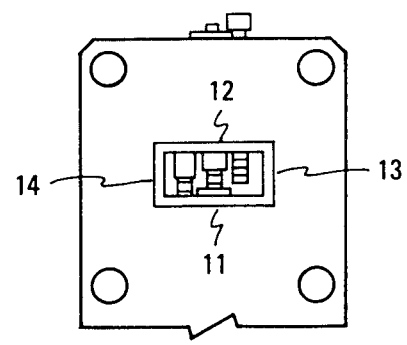

FIG. 1 is a side elevation view partly in cross-section of the microwave source embodying the invention. The microwave source may be seen to consist of a flanged rectangular waveguide and five electrical adjusting elements.

The rectangular waveguide has a floor 11, a ceiling 12, side walls 13 and 14 (not illustrated in FIG. 1), an end wall 15 at the left extremity (as seen in FIG. 1) of the waveguide and an opening and a surrounding mounting flange 16 at the right extremity of the waveguide. Four of the five adjusting elements, whose construction and function will be described below, are mounted in the ceiling and one is mounted in the floor of the waveguide, all five entering the waveguide for effecting electrical performance.

FIG. 1 also depicts the field distribution within the microwave source, which may be regarded as consisting of a resonator section and an impedance matching section for coupling the source to a load. As illustrated, the E field is perpendicular to the floor 11 and ceiling 12 of the waveguide. Minimums of the E field exist in proximity to the shorted left end of the waveguide and approximately $\frac{2}{3}$ of the length of the waveguide from the left end. The second E field minimum defines where the resonator section of the waveguide ends and the impedance matching section of the waveguide source begins. The E field maximum, a useful position of E field tuning or temperature compensation, occurs approximately $\frac{1}{3}$ the way from the left end of the waveguide. In addition, a significant E field, normally less than maximum is shown at the opening at the flanged end of the waveguide signifying the coupling of energy to an external load. As is well understood, the H field, which is not illustrated in FIG. 1, extends orthogonally to the E field, the parallel lines lying in planes parallel to the floor 11 and ceiling 12 of the waveguide. The H field lines also go through maxima and minima, the H field maxima occurring in proximity to the left end wall 15 of the cavity and in proximity to the second E field null. Assuming that the oscillator is operating with the E and H field distributions just described, it may be said to operate in a $TE_{101}$ mode.

Oscillations are established in the waveguide by means of a negative resistance device 17 located in proximity to the left end wall of the cavity. A suitable negative resistance device is a Gunn diode. The Gunn diode is supported with one electrode in good radio frequency contact with the floor of the microwave cavity, and with the second electrode connected to a coupling post 18 which is in good radio frequency contact with the ceiling of the quarter wave coaxial choke 25. As FIG. 1 indicates, the coupling post 18, the ceiling 12, the left end wall 15, the floor 11, and the diode 17 form a closed circular path in a vertical plane embracing a portion of the H field where it is at its greatest strength in proximity to the end wall 15. The coupling loop so formed at the left extremity of the cavity provides effective coupling between the negative resistance device and the resonator, thereby facilitating efficient energy transfer.

The second boundary of the resonator section and the impedance matching section are defined by the members 19, 20 and 21 which produce a low impedance between floor and ceiling of the waveguide. The members 19 and 20 are respectively a varactor diode and a coupling post extending between the floor and ceiling of the waveguide. The varactor diode 19, as will be explained, applies a modulating signal to the oscillator. The varactor diode has its lower electrode radio frequency coupled to the floor of the waveguide. The coupling post 20, which is in good radio frequency contact with the ceiling of the waveguide by the quarter wave coaxial choke 26, extends downward from the ceiling into contact with the upper electrode of the varactor diode. Typically, the coupling post 20 is insulated from the ceiling of the waveguide by the insulation film on the coaxial choke and has a suitably low inductive impedance, e.g. 0.4 nanohenries for 22 gigahertz operation, to permit passage of the modulating signal (typically 5 mHz) to the varactor diode. The member 21 is an adjusting screw extending down from the ceiling of the waveguide towards the floor of the waveguide. It is positioned to the right of the varactor diode post assembly and, as will be shortly explained, forms with it a second closed circular path in a vertical plane in a second region of the waveguide having an intense H field. Viewed for purposes of defining the boundary between the oscillator section and impedance matching section, the members 19, 20 and 21 together define a low impedance path between floor and ceiling of the waveguide and thereby establish the null of the E field. In practice, the E field null that establishes this boundary will necessarily occur outside the varactor diode and post assembly, and will often null slightly inside the loading adjustment screw as well.

As suggested above, the arrangement provides sensitive varactor modulation of the oscillator. The varactor diode 19 and coupling post 20, the ceiling 12, the loading adjustment screw 21, the capacitance coupling the lower end of the screw 21 to the waveguide floor, and the floor 11 form a second closed circular path coupling in a vertical plane embracing a portion of the H field near the E field null and the H field maximum. The result is a very effective H field coupling between the varactor diode and the resonator.

The location of the members 19, 20 and 21 at opposite ends of the resonator from the Gunn diode 17 and diode coupling post 18 provides both a convenient arrangement in that the adjusting members are spaced sufficiently apart in a rather small space so as to avoid mechanical interference and at the same time both are in the optimum electrical positions. In addition, the positioning of the Gunn diode 17 near the low impedance end wall 15 has produced a stable carrier frequency that is not adversely affected in adjustment of the load adjusting screw 21, while the positioning of the varactor diode near the E field null has permitted a very substantial modulation sensitivity and a good output coupling flexibility.

The loading adjustment screw 21 adjusts the impedance match of a load presented to the flange open end of the microwave source. In practice, the flange is designed to be coupled to a second rectangular waveguide typically having a higher characteristic impedance. As noted above, the members 19, 20 and 21 define the boundary between the resonator section of the waveguide and the impedance matching section of the waveguide. The members 19 and 20, which are respectively the varactor diode and coupling post, have a fixed position and while they extend fully across the waveguide, they still present a sufficiently high impedance to prevent nulling the field at their position in the cavity.

The load adjusting screw 21, which is positioned at a fixed distance to the right of the members 19 and 20, may be raised or lowered within the cavity by a rotational adjustment. When the adjusting screw is introduced to an amount where its impedance equals that of the members 19 and 20, its effect on the length of the resonator section and the impedance matching section will be approximately equal to that of 19, 20. If the adjusting screw is raised the oscillating section will be shortened slightly (raising the oscillator frequency) and the matching section lengthened increasing the output impedance presented to the load. If the adjusting screw is lowered, the oscillator section will be lengthened slightly (lowering the oscillator frequency), and the matching section will be shortened decreasing the output impedance provided to a load. (The load coupling is set to the desired value for the desired degree of power transfer, and the oscillator retuned by means (23) to the desired carrier frequency.) The actual null will usually occur outside of members 19 and 20 and inside member 21, when 21 is elevated, and will move into coincidence with the member 21 when it is in its lowered position.

While the microwave source has been down to scale (1" equals 3/16" in FIG. 1), the impedance matching section may be set to have a length slightly above a quarter wavelength (0.261 wavelength). The setting permits a match to either a higher (e.g. 649 ohms) or lower impedance load. The arrangement permits adjustment between an upper limit (given an average load impedance) in which the loading is so great that oscillations are suppressed and a lower limit in which only a small amount of energy escapes from the resonator cavity and essentially all dissipation takes place within the cavity. (The cavity operates with a natural Q of about 2000 and a loaded Q of about 200 ohms.)

Thus, the load adjusting screw 21, acting in conjunction with the fixed members 19 and 20 has the effect of an iris in controlling the degree of output coupling from the cavity resonator to a load. The arrangement is preferrable to a fixed iris in that one may reach an exact setting through a convenient and reversable adjustment.

The elements 11, 16, 17 and 22 enter into the thermal design. The Gunn diode 17, for which the illustrated cavity is designed, produces radio frequency energy as a small percentage (e.g. 3%) of the power dissipated. Accordingly it is desirable that the heat dissipated in the diode be transferred to a suitable sink with a minimum adverse effect on the microwave source. In the present design, the Gunn diode is supported in good thermal contact with a substantial copper member 22 bonded to the under surface of the waveguide floor. The member 22 makes a good thermal contact with the diode, the floor 11 of the waveguide, and the mounting flange 16. The flange 16 is of very substantial cross-section and provides a final thermal connection to a suitable heat sink. The design prevents substantial elevation in temperature of the Gunn diode per se. It also tends to hold the structure of the microwave resonator to the temperature of the sink coupled to the flange 16 which is at the ambient of the entire equipment.

The adjustments elements 24 and 23 complete the thermal compensation of the arrangement and fix the center frequency of the oscillator. The temperature compensating member 24 is attached to the ceiling of the waveguide at approximately the maximum point in the E field. The device is formed with a conductive plunger supported near the plane of the upper surface by members having a differential coefficient of expansion. The cavity, which exhibits a negative coefficient of frequency change with temperature variation, requires that the temperature compensation provide a positive frequency change with temperature variations. The location at the maximum point in the E field provides maximum sensitivity for the compensating adjustment 24. The assembly is of a known design in which the degree of insertion into the support adjusts the slope of the temperature coefficient. Thus an approximate temperature compensation is provided, permitting operation over a temperature range of from −30 to +60 degree C. with a frequency drift of less than ±0.02%.

The center frequency of the resonator is set by the adjustable capacitive post 23 which is insertable by means of a screw adjustment. It is placed near the maximum point in the E field for maximum effect and permits the oscillator to be tuned to a desired center frequency. The members 23 and 24 just described are placed on opposing surfaces of the resonator cavity and at the electrical center of the cavity measured along the wavelength axis. One control is set to the front of the waveguide (in the FIG. 1 disposition), and the other to the rear, again to minimize material interference between the two. This positioning provides maximum sensitivity for the four principal adjusting means and substantial independance between all four. In addition, since the means 17, 18 and 19, 20, 21 are at the ends of the cavity of the resonator section, this positioning of 23, and 24 permits maximum mechanical convenience and at the same time a minimum in electrical interaction between all four.

The embodiment described is designed for digital operation at the 22 gigahertz frequency band and produces an output of 80 milliwatts with a 6 volt DC supply suitable for line of sight communication with a suitable dish antenna. If abrupt varactor diodes, whose gamma is one-half are employed as direct modulators of the oscillator frequency, a tuning sensitivity of 2.5 to 5.0 megahertz per volt is obtained. If more costly varactor diodes having a gamma greater than one-half (i.e. hyperabrupt varactor diodes) are employed, tuning sensitivities of 8 megahertz per volt or higher can be obtained.

The upper modulating signal for digital operation (in the direct modulation mode) is typically 10 megabits.

The assembly is fabricated of invar alloy with the thermal conductor 22 being copper brazed to the under surface of the waveguide. The interior surfaces are silver plated.

What is claimed is:

1. A microwave source comprising
   A. a rectangular waveguide with a shorting wall at one end, the side walls, floor, and ceiling extending toward an opening at the other end thereof at a first characteristic impedance $Z_1$,
   said waveguide being effectively divided into a resonator section extending from said one end for an electrical length of 180 degrees, and an adjustable load matching section extending from said resonator section to said opening at said other end, said matching section having an electrical length variable through 90 degrees for adjustably coupling energy from said resonator section via said opening to a waveguide load having a second characteristic impedance $Z_2$, differing from $Z_1$,
   B. a negative resistance device and a first coupling post connected in series between said floor and ceiling of said resonator section, positioned near said shorted end to complete an H field coupling loop to sustain oscillations within said resonator section,
   C. a varactor diode and a second coupling post connected in series between the floor and ceiling of said waveguide, and a third post, adjustably extending between the floor and ceiling of said waveguide at a position more remote than said second post from said end wall for forming a low impedance between the ceiling and floor of said waveguide which defines the boundary between said resonator section and said matching section, said series connected varactor diode and second post and said third post being spaced to provide an H field coupling loop near the outer boundary of said resonator section for achieving varactor tuning sensitivity, the adjustment of said third post controlling the electrical length of said impedance matching section and thereby providing said adjustable coupling.

2. The oscillator set forth in claim 1, wherein an adjustable temperature compensating member is provided, entering the waveguide through said floor or ceiling surface, oriented perpendicular to the floor and ceiling thereof and positioned approximately 90 electrical degrees from said shorting end wall, to provide a capacitance versus temperature characteristic of adjustable slope.

3. The oscillator set forth in claim 2, wherein vernier tuning means comprising a dielectric rod is provided, entering the waveguide through a surface opposite to that through which said temperature compensating means enters, oriented perpendicular to the floor and ceiling thereof and positioned approximately 90 electrical degrees from said shorting end wall to adjust the operating frequency of said oscillator to a desired value.

4. The oscillator set forth in claim 3, wherein said negative resistance device is a Gunn diode positioned on the floor of said waveguide.

5. The oscillator set forth in claim 4, wherein a thermally conductive mounting flange is provided at said other waveguide end for providing an electrically efficient connection to said waveguide load, and wherein a high thermal conductivity member is provided in good thermal contact with said Gunn diode and the floor of said cavity between said diode and said flange for providing a low impedance thermal connection between said diode and said flange.

* * * * *